(12) United States Patent
Ostermann et al.

(10) Patent No.: US 7,333,522 B2
(45) Date of Patent: Feb. 19, 2008

(54) POLARIZATION CONTROL OF VERTICAL DIODE LASERS BY MONOLITHICALLY INTEGRATED SURFACE GRATING

(75) Inventors: Johannes Michael Ostermann, Ulm (DE); Pierluigi Debernardi, Turin (IT)

(73) Assignee: Ulm-Photonics, Ulm (DE)

( * ) Notice: Subject to any disclaimer, the term of this patent is extended or adjusted under 35 U.S.C. 154(b) by 245 days.

(21) Appl. No.: 10/991,992

(22) Filed: Nov. 18, 2004

(65) Prior Publication Data

US 2005/0169343 A1 Aug. 4, 2005

(30) Foreign Application Priority Data

Nov. 18, 2003 (DE) ................. 103 53 951

(51) Int. Cl.
*H01S 5/00* (2006.01)

(52) U.S. Cl. .................. 372/45.01; 372/46.01

(58) Field of Classification Search ............. 372/27, 372/50.11, 50.124, 81, 72, 35, 45.01, 43.01, 372/50.1
See application file for complete search history.

(56) References Cited

U.S. PATENT DOCUMENTS 5,255,578 A * 10/1993 Liou ............... 81/125
5,301,201 A * 4/1994 Dutta et al. ............. 372/43.01
5,357,591 A * 10/1994 Jiang et al. .................. 385/37
5,995,531 A   11/1999 Gaw et al. .................. 372/96
6,061,381 A * 5/2000 Adams et al. ............... 372/96
6,154,479 A * 11/2000 Yoshikawa et al. .......... 372/96
6,191,890 B1   2/2001 Baets et al. ................ 359/572
6,399,407 B1 * 6/2002 O'Brien et al. ............... 438/29
6,507,595 B1 * 1/2003 Kapon et al. .......... 372/45.013
RE38,682 E * 1/2005 Taylor .................... 372/50.11

FOREIGN PATENT DOCUMENTS

EP    0 798 574 A2    10/1997
EP    0 798 574 A3    9/1998

\* cited by examiner

*Primary Examiner*—Minsun Oh Harvey
*Assistant Examiner*—Tuan N. Nguyen

(57) ABSTRACT

There is provided a laser. The laser includes a substrate, a first Bragg reflector layer sequence on the substrate, an active layer sequence on the first Bragg reflector layer sequence, a second Bragg reflector layer sequence on the active layer sequence, and a voltage source for applying a voltage via the active layer sequence to generate a beam of laser radiation. At least one of the first Bragg reflector layer sequence, the active layer sequence or the second Bragg reflector layer sequence includes a layer having a periodic pattern positioned in a direction of the beam to stabilize a polarization of the beam.

35 Claims, 3 Drawing Sheets

POLARIZATION CONTROL OF VERTICAL DIODE LASERS BY MONOLITHICALLY INTEGRATED SURFACE GRATING

CROSS-REFERENCE TO RELATED APPLICATION

The present application is claiming priority in German Patent Application No. DE 103 53 951.4, filed Nov. 18, 2003.

BACKGROUND

1. Field of the Invention

The invention relates generally to vertical diode lasers, and particularly to vertical diode lasers having at least one patterned layer, and also to the production and use thereof.

2. Description of the Related Art

From as early as the mid nineteen eighties diode lasers have assumed a salient position in laser technology. High efficiency, compactness and very simple handling are the most important advantages of the diode laser. They have been used hitherto primarily in communication and information technology, in fiber-optic networks and CD players through to laser printers and professional printing systems.

The vertical diode laser (vertical cavity surface emitting laser; VCSEL) has proved to be particularly advantageous, this laser being distinguished primarily by simpler mounting and cooling and also better optical properties of the laser light in comparison with so-called edge emitters, which emit the laser light parallel to the substrate, that is to say laterally. Further advantages are a lower energy consumption and a more compact electrical circuitry, which affords price advantages particularly in the case of mass production applications, and also the possibility of use for on-wafer testing.

Unlike conventional edge emitters, however, conventional vertical diode lasers do not have a defined direction of polarization. Whereas in edge emitters light is propagated parallel to the quantum film and the transition matrix elements thus differ for the two directions of polarization, in VCSELs the propagation wave vector is perpendicular to the quantum films, as a result of which the gain is identical for all conceivable polarizations. No polarization is likewise preferred by the cylindrical resonator of conventional VCSELs.

The linear electro-optical effect causes, in VCSELs, a deformation of the refractive index ellipsoid along the crystal axes [011] and [0-11] with the consequence that the polarization of the fundamental mode of a vertical laser diode is usually oriented along one of these two crystal axes. The next higher mode is generally polarized orthogonally with respect to the fundamental mode. A current change or an additional external strain may result in an abrupt change in the polarization of a mode between the two crystal axes. These so-called polarization jumps are associated with a shift in the emission wavelength on account of the electro-optical effect. These polarization jumps generally limit the use of VCSELs in polarization-dependent optical systems. By way of example, the polarization jumps are disadvantageous in printing systems in which media having a different absorption for different polarizations are printed. Moreover, the polarization jumps lead to an increased noise in optical data transmission. In addition, the polarization jumps may prevent use in spectroscopy due to the influence on the emission wavelength.

U.S. Pat. No. 5,995,531 discloses, for example, forming the upper mirror of a VCSEL with a cross section that deviates from the circular form, for example elliptically, in order thus to stabilize the polarization. What is disadvantageous about this is that the coupling into an optical fiber, for example during optical data transmission, is made more difficult in the case where a cross section of the upper mirror of a VSCEL deviates from the circular form.

In order to stabilize the polarization, it is furthermore known to apply a vertical laser diode on more highly indexed substrates, for example on a [311] substrate. However, this leads to an impairment of the other laser properties and permits only one predetermined direction of polarization.

In addition to many other unsatisfactory approaches that are not described here, the use of surface gratings for polarization control has already been attempted earlier, but this, too, has not led to satisfactory results heretofore.

SUMMARY OF THE INVENTION

The invention is therefore based on the object of demonstrating a way of being able to define the direction of polarization of monomode and multimode vertical diode lasers for all modes and all operating conditions arbitrarily relative to the crystal structure in a specific direction.

The object is achieved in a surprisingly simple manner by the subject matter of the independent claims. Advantageous embodiments and developments are defined in the subclaims.

Accordingly, a vertical diode laser according to the invention comprises at least a substrate, a first Bragg reflector layer sequence applied on the substrate, an active layer sequence for generating laser radiation applied on the first Bragg reflector layer sequence, a second Bragg reflector layer sequence applied on the active layer sequence, and means for applying a voltage via the active layer sequence, wherein at least one layer of one of the layer sequences is patterned periodically, and wherein the period of the patterning and the position of the patterning in the beam direction of the laser are selected in such a way that the polarization of the laser is stabilized. A grating is advantageously formed by the periodic patterning.

The Bragg reflector layer sequences are constructed from a multiplicity of layer pairs, each pair in each case comprising a layer having a high refractive index and a layer having a low refractive index. The layers have a thickness that corresponds to the optical path length of $\lambda/4$ where $\lambda$ is the emission wavelength of the VCSEL. By way of example, the layer pairs may have AlGaAs with in each case a different concentration of aluminum. The substrate could have GaAs, for example. However, it is also possible to use any other suitable materials. The active layer sequence has at least one quantum well, generally multiple quantum wells (MQW).

The Bragg reflector layer sequences may also have, as well as the $\lambda/4$ layers described, one or a plurality of further layers, which may preferably be formed as the topmost layer or layers. One of these further layers may also have the periodic patterning.

The inventors have found that the polarization of a VCSEL can be stabilized and furthermore also oriented in a defined manner by means of a periodic patterning, in particular by means of a grating. This holds true for multimode VCSELs as well. The inventors were able to show experimentally, for example, that even in the case of highly multimode vertical diode lasers having up to 14 modes, a surface grating according to the invention can suppress the orthogonal polarization of 15 dB over the entire characteristic curve given an output power of up to 8 mW. Polarization jumps in the event of a change in current intensity or temperature or upon addition of an external strain were not observed over the entire characteristic curve.

The inventors have surprisingly found that, for the polarization control of a VCSEL, it is absolutely necessary to select position, depth and period of the periodic patterning very precisely. In this case, period and depth are greatly dependent on the layer structure.

Particularly advantageously, the periodic patterning has a period of between 0.3 and 1.5 µm, in particular between 0.6 and 1.0 µm. Given an emission wavelength of the vertical diode laser of $\lambda$, the periodic patterning preferably has a value of between 0.5 $\lambda$ and 1.5 $\lambda$, in particular between 0.7 $\lambda$ and 1.3 $\lambda$.

The periodic patterning is additionally preferably formed as a surface structure of a layer, in particular the topmost layer of the second Bragg reflector layer sequence. The patterning may advantageously be formed by cutouts in this layer. In addition to the period and the depth of the patterning, the position of the cutouts is the parameter that crucially influences the polarization properties of the VCSEL according to the invention. Particularly advantageously, the cutouts have a depth of between 10 and 150 nm, in particular between 40 and 90 nm.

For a VCSEL having an emission wavelength of essentially 850 nm, the depth of the cutouts preferably has values of between 40 and 70 nm given a period of the patterning of 0.7 µm.

As an alternative, the periodic patterning may also be effected on the topmost layer of the second Bragg reflector layer sequence by applying a structure having at least one metal or a dielectric material.

It is also possible for at least one further layer to be applied and patterned. Applying further layers above and below the patterned layer with different thicknesses also lies within the scope of the invention.

As mentioned, the periodic patterning may also be formed by elevations applied to the topmost layer of the second Bragg reflector layer sequence. For this purpose, the topmost $\lambda/4$ layer of the second Bragg reflector layer sequence may firstly be thinned. This may be effected by applying the topmost layer with a thickness less than $\lambda/4$ or by subsequently etching said layer over the whole area.

It also lies within the scope of the invention to combine the periodic patterning described with a surface relief in order to increase the power of selected laser modes.

The surface relief may be formed in two ways, in principle. The topmost layer of the second Bragg reflector layer sequence may have a cutout or a further layer with a suitable patterning may be applied to the topmost layer of the second Bragg reflector layer sequence.

In order to increase the power of the fundamental mode, the topmost layer of the second Bragg reflector layer sequence may have a cutout in the form of an annulus of differing thickness centrally with respect to the light exit area of the laser, as a result of which there remains only an area in the center of the light exit area with a thickness of essentially $\lambda/4$. On the other hand, in order to increase the power of the fundamental mode, a further layer may be applied to the topmost layer of the second Bragg reflector layer sequence, said further layer being patterned in such a way that it has a cutout centrally with respect to the light exit area.

A method according to the invention for producing a polarization-stable VCSEL comprises providing a substrate, applying a first Bragg reflector layer sequence to the substrate, applying an active layer sequence to the first Bragg reflector layer sequence for generating laser radiation, applying a second Bragg reflector layer sequence to the active layer sequence, and providing a means for applying a voltage via the active layer sequence, wherein at least one layer of one of the layer sequences is applied in periodically patterned fashion, and wherein the period, the depth and the position of the patterning in the beam direction of the laser are selected in such a way that the polarization of the laser is stabilized.

Preferably, applying the at least one layer with a periodic patterning comprises applying a layer having a grating structure.

The period, depth and position of the patterning in the beam direction that are preferably to be complied with in the method according to the invention for producing a polarization-stable VCSEL correspond to those described above for the VCSEL.

Particularly preferably, the topmost layer of the second Bragg reflector layer sequence is applied in periodically patterned fashion, wherein particularly the surface of the layer is patterned.

The patterning may advantageously be effected by means of customary photolithographic methods, wherein trenches are etched into the surface of the layer by dry-chemical and/or wet-chemical and/or physical etching methods. In this case, the etching depth is preferably between 10 and 150 nm, in particular between 40 and 90 nm.

An alternative variant of applying the at least one layer with a periodic patterning provides for the topmost layer of the second Bragg reflector layer sequence firstly to be thinned relative to the thickness of usually $\lambda/4$. This may be done by already applying the layer with a smaller thickness, or by subsequent etching. Preferably, the layer thickness by which the topmost layer of the second Bragg reflector layer sequence is thinned lies between 10 and 150 nm, in particular between 40 and 90 nm.

In this variant, further material is deposited in patterned fashion onto the thinned layer, wherein a dielectric material or a metal, for example, may be used for this purpose. In an advantageous manner, it is also possible for a plurality of materials to be deposited one after the other, for example the metals titanium and gold.

For the surface relief already described above for increasing the power of selected laser modes, the method according to the invention provides for at least one layer of the layer sequences to be applied with a further patterning in such a way that the power of at least one laser mode is preferably amplified.

In order to increase the power of the fundamental mode, the method provides for etching a cutout having a cross section in the form of an annulus into the topmost layer of the second Bragg reflector layer sequence, so that an elevation is formed centrally with respect to the light exit area of the laser.

As an alternative variant for increasing the power of the fundamental mode, the method provides for applying a further layer on the second Bragg reflector layer sequence and etching a cutout into said further layer centrally with respect to the light exit area of the laser.

It furthermore lies within the scope of the invention to specify a system for optical data transmission, comprising a vertical diode laser according to the invention.

Furthermore, the invention comprises a spectroscopic system, in particular for measurement of absorption lines, having a vertical diode laser according to the invention.

Finally, the invention comprises the use of a Bragg reflector layer sequence with at least one periodically patterned layer for stabilizing the polarization of a vertical diode laser.

The invention is described in more detail below by way of example on the basis of preferred embodiments and with reference to the accompanying drawings. In this case, identical reference symbols in the drawings designate identical or similar parts.

DESCRIPTION OF THE INVENTION

Figure 1:
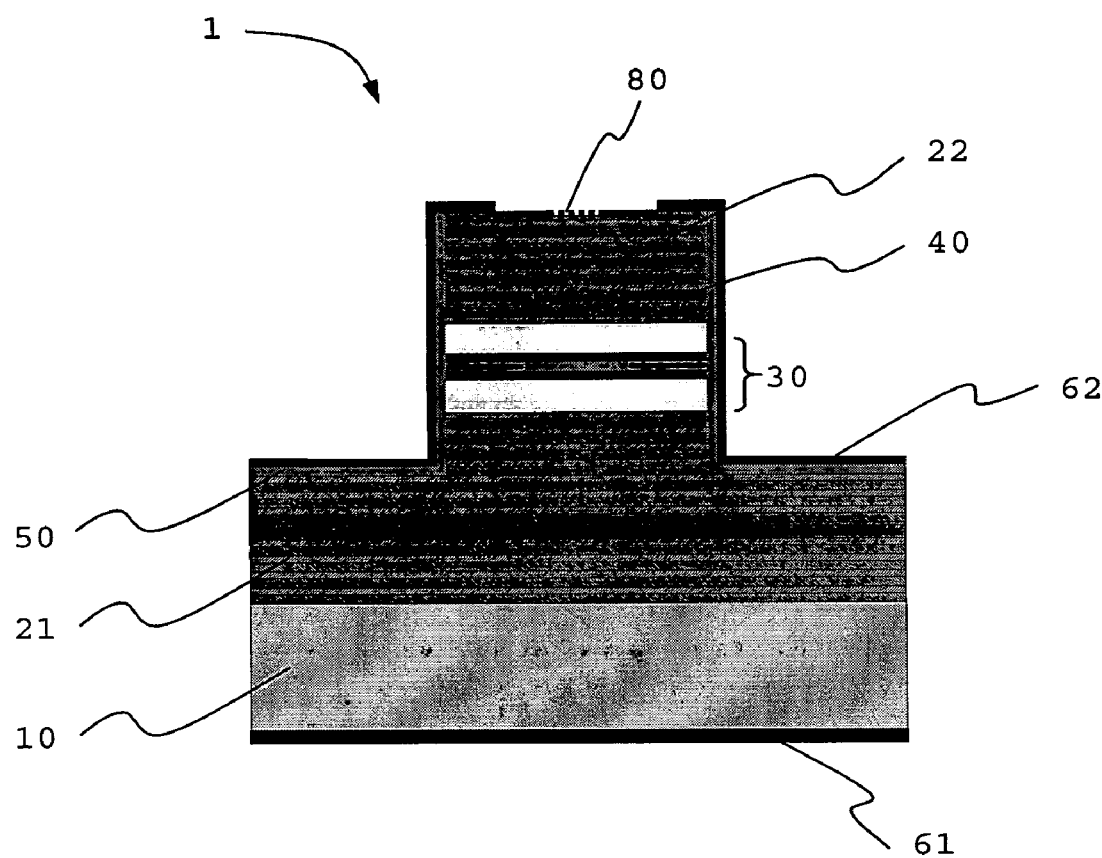
FIG. 1 diagrammatically shows the construction of a VCSEL according to the invention.

FIG. 1 diagrammatically shows the construction of a VCSEL 1 according to the invention. A first Bragg reflector layer sequence 21 is applied on a substrate 10, for example a GaAs substrate. Arranged between said first Bragg reflector layer sequence 21 and a second Bragg reflector layer sequence 22 is an active layer sequence 30, which has multiple quantum wells and serves for generating the laser radiation. An oxide aperture 40 is provided within the second Bragg reflector layer sequence 22. The VCSEL furthermore has metallic contact areas 61 and 62, and also an insulation 50. As an alternative, the VCSEL could also have an intra-cavity contact, for example. The topmost layer of the second Bragg reflector layer sequence 22 has a surface grating 80 with mutually parallel trenches etched into the layer.

Figure 2A:
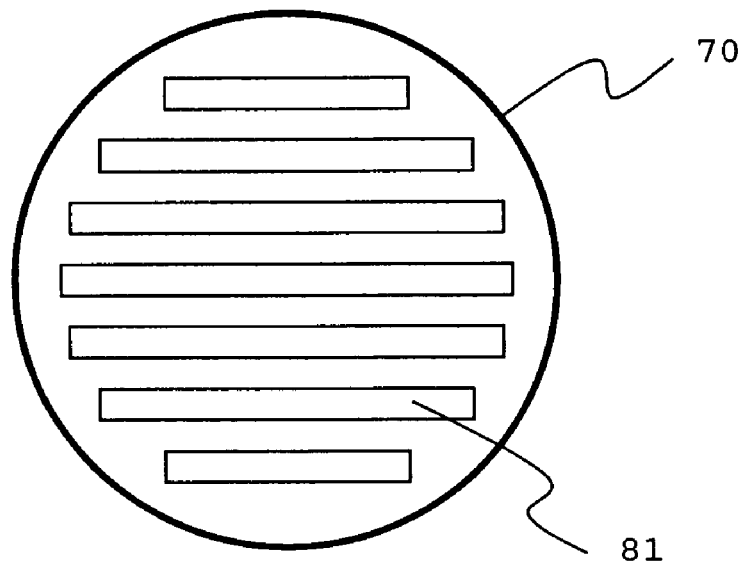
FIG. 2A shows a diagrammatic plan view of an embodiment of a VCSEL according to the invention with a surface grating having a period of 0.7 μm.
Figure 2B:
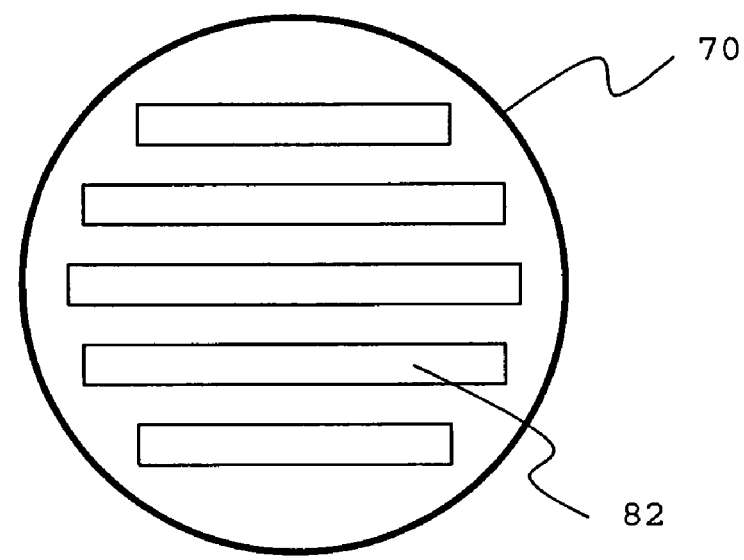
FIG. 2B shows a diagrammatic plan view of an embodiment of a VCSEL according to the invention with a surface grating having a period of 0.9 μm.

Various grating structures investigated for VCSELs having an emission wavelength of 850 nm and 960 nm are illustrated in plan view in FIGS. 2A and 2B. The illustration shows in each case the boundary of the contact ring 70, and also grating trenches 81 and 82 etched into the topmost layer of the second Bragg reflector layer sequence.

The periodic patterning illustrated in FIGS. 2A and 2B have a grating trench centrally. For this purpose, the patterning could also be shifted in the layer plane. Thus, the periodic patterning could also have a central elevation, for example.

In FIG. 2A, the grating period is 0.7 μm. In the case of this grating period, a strong influence on the polarization properties of the VCSEL could be ascertained for etching depths of 50 nm of the grating trenches.

FIG. 2B shows a surface grating having a grating period of 0.9 μm. In the case of this grating period, only a small influence on the polarization properties of the VCSEL was ascertained.

It becomes evident from this that period, etching depth and position must be selected very precisely in order to obtain an optimum effect on the polarization properties of the VCSEL. This is certainly a reason why grating structures known from the prior art have not led to a satisfactory result heretofore.

Figure 3:
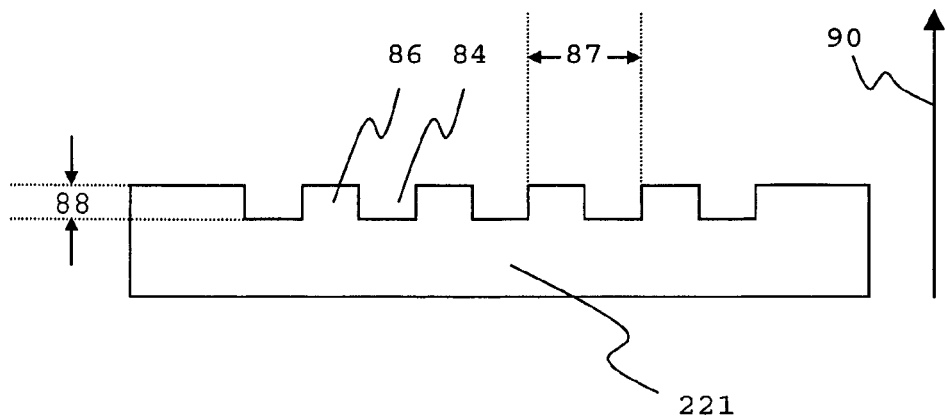
FIG. 3 shows a diagrammatic cross-sectional view of a periodic patterning of a VCSEL according to the invention.

FIG. 3 shows a diagrammatic cross-sectional view of a periodic patterning of a VCSEL according to the invention, said patterning being produced by etching grating trenches 84 into the topmost layer 221 of the second Bragg reflector layer sequence 22. The patterning has a periodicity in a direction parallel to the layer plane, formed by alternate cutouts 84 and elevations 86. In this exemplary embodiment, the cutouts 84 and elevations 86 have an essentially rectangular cross section with steep edges. However, the edges may also be flattened, particularly with the use of customary wet-chemical etching methods. Other forms, such as a sawtooth or wavy form, for example, also lie within the scope of the invention.

The cutouts 84 and elevations 86 have an essentially identical width in this exemplary embodiment. However, a differing width of the cutouts 84 and elevations 86 likewise lies within the scope of the invention.

Besides the etching depth 88, the period 87 of the patterning is crucial for the polarization properties of the VCSEL given a sufficient position of the patterning.

Figure 4:
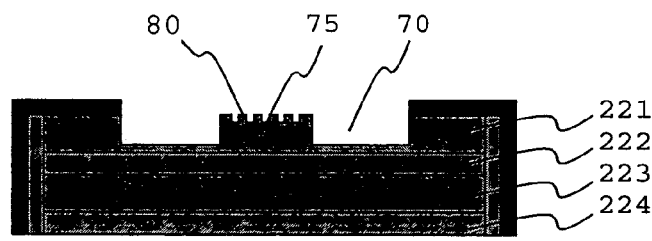
FIG. 4 shows a diagrammatic cross-sectional view and plan view of an embodiment of a VCSEL according to the invention with a surface relief.
Figure 4:
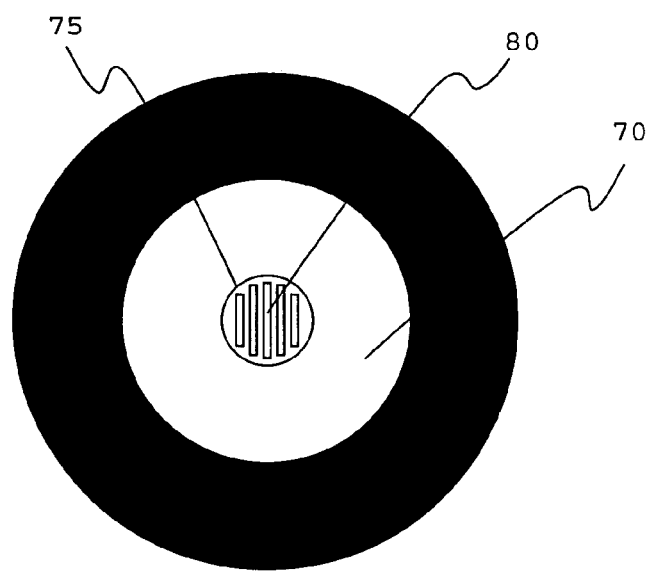

The embodiment of a VCSEL according to the invention that is illustrated in FIG. 4 comprises a further patterning of the topmost layer of the second Bragg reflector layer sequence, which forms a surface relief 75 for suppressing higher-order laser modes. The topmost four layers 221 to 224 of the second Bragg reflector layer sequence are illustrated. A cutout having a cross section in the form of an annulus is etched into the topmost layer 221, so that a circular surface relief 75 remains. The periodic patterning 80 for controlling the polarization of the VCSEL is arranged on the surface relief 75 in this exemplary embodiment.

The invention claimed is:

1. A laser, comprising:
    a substrate;
    a first Bragg reflector layer sequence on said substrate;
    an active layer sequence on said first Bragg reflector layer sequence;
    a second Bragg reflector layer sequence on said active layer sequence; and
    a voltage source for applying a voltage via said active layer sequence to generate a beam of laser radiation,
    wherein at least one of said first Bragg reflector layer sequence, said active layer sequence or said second Bragg reflector layer sequence includes a layer having a periodic pattern positioned in a direction of said beam to stabilize a polarization of said beam,
    wherein said laser radiation has a wavelength of about 850 nanometers, and
    wherein said periodic pattern has a period of between about 0.7 micrometers, and a thickness of between about 40 nanometer and about 70 nanometers.

2. The laser of claim 1,
    wherein said first and second Bragg reflector layer sequences each include a plurality of layers of a material having a first refractive index, in alteration with a plurality of layers of a material having a second refractive index, and
    wherein said first refractive index is higher than said second refractive index.

3. The laser of claim 2, wherein said second Bragg reflector layer sequence has a further layer.

4. The laser of claim 3, wherein said further layer is a topmost layer of said second Bragg reflector layer sequence.

5. The laser of claim 1, wherein said periodic pattern comprises a grating.

6. The laser of claim 1, wherein said layer having said periodic pattern comprises a patterned surface.

7. The laser of claim 1, wherein said periodic pattern comprises a cutout in a topmost layer of said second Bragg reflector layer sequence.

8. The laser of claim 7, wherein said cutout has a depth of between about 10 nanometers and about 150 nanometers.

9. The laser of claim 7, wherein said cutout has a depth of between about 40 nanometers and about 90 nanometers.

10. The laser of claim 1,
wherein said periodic pattern is formed by an elevation applied to a topmost layer of said second Bragg reflector layer sequence, and
wherein said topmost layer of said second Bragg reflector layer sequence is thinned.

11. The laser of claim 10, wherein said topmost layer of said second Bragg reflector layer sequence is thinned to a thickness of between about 10 nanometers and about 150 nanometers.

12. The laser of claim 10, wherein said topmost layer of said second Bragg reflector layer sequence is thinned to a thickness of between about 40 nanometers and about 90 nanometers.

13. The laser of claim 1, wherein at least one of said first Bragg reflector layer sequence, said active layer sequence or said second Bragg reflector layer sequence includes a layer having a further patterning so that power of a mode of said laser is amplified.

14. The laser of claim 13, wherein said second Bragg reflector layer sequence has a topmost layer that has a cutout in a form of an annulus situated centrally with respect to an exit area of said laser radiation so that a fundamental mode of said laser is amplified.

15. The laser of claim 13, wherein said second Bragg reflector layer sequence has a further patterned layer having a circular cutout centrally situated with respect to an exit area of said laser radiation so that a fundamental mode of said laser is amplified.

16. A method of producing a laser, comprising:
applying a first Bragg reflector layer sequence to a substrate;
applying an active layer sequence to said first Bragg reflector layer sequence;
applying a second Bragg reflector layer sequence to said active layer sequence; and
providing a voltage source for applying a voltage via said active layer sequence to generate a beam of laser radiation;
wherein at least one of said first Bragg reflector layer sequence, said active layer sequence or said second Bragg reflector layer sequence includes a layer having a periodic pattern positioned in a direction of said beam to stabilize a polarization of said beam,
wherein said laser radiation has a wavelength of about 850 nanometers, and
wherein said periodic pattern has a period of about 0.7 micrometers and a thickness of between about 40 nanometers and about 70 nanometers.

17. The method of claim 16,
wherein said first and second Bragg reflector layer sequences each include a plurality of layers of a material having a first refractive index, in alteration with a plurality of layers of a material having a second refractive index, and
wherein said first refractive index is higher than said second refractive index.

18. The method of claim 17, wherein said second Bragg reflector layer sequence has a further layer.

19. The method of claim 18, wherein said further layer is a topmost layer of said second Bragg reflector layer sequence.

20. The method of claim 16, wherein said layer having said periodic pattern comprises a grating structure.

21. The method of claim 16, wherein said layer having said periodic pattern comprises a patterned surface.

22. The method of claim 16, wherein said layer having a periodic pattern is provided by an etching technique selected from the group consisting of dry-chemical etching, wet-chemical etching, physical etching, and any combination thereof.

23. The method of claim 22, wherein said etching technique comprises etching a trench into a topmost layer of said second Bragg reflector layer sequence.

24. The method of claim 23, wherein said trench has a depth of between about 10 nanometers and about 150 nanometers.

25. The method of claim 23, wherein said trench has a depth of between about 40 nanometers and about 90 nanometers.

26. The method of claim 16, wherein said layer having a periodic pattern is provided by depositing a material selected from the group consisting of a dielectric, a metal, and a combination thereof.

27. The method of claim 26, wherein said material is deposited on a topmost layer of said second Bragg reflector layer sequence.

28. The method of claim 27, wherein said topmost layer of said second Bragg reflector layer sequence is thinned to a height of between about 10 nanometers and about 150 nanometers.

29. The method of claim 27, wherein said topmost layer of said second Bragg reflector layer sequence is thinned to a height of between about 40 nanometers and about 90 nanometers.

30. The method of claim 16, wherein at least one of said first Bragg reflector layer sequence, said active layer sequence or said second Bragg reflector layer sequence includes a layer having a further patterning so that power of a mode of said laser is amplified.

31. The method of claim 30, further comprising etching a cutout having a cross section in a form of an annulus into a topmost layer of said second Bragg reflector layer sequence, so that a circular elevation is formed centrally with respect to a exit area of said laser radiation, so that power of a fundamental mode of said laser is amplified.

32. The method of claim 30, comprising:
applying a further layer on said second Bragg reflector layer sequence; and
etching a cutout having a circular cross section into said further layer, so that an elevation in a form of an annulus is formed centrally with respect to an exit area of said laser radiation, so that power of a fundamental mode of said laser is amplified.

33. A system for optical data transmission, comprising a laser having:
a substrate
a first Bragg reflector layer sequence on said substrate;
an active layer sequence on said first Bragg reflector layer sequence;
a second Bragg reflector layer sequence on said active layer sequence; and a voltage source for applying a voltage via said active layer sequence to generate a beam of laser radiation, wherein at least one of said first Bragg reflector layer sequence, said active layer sequence or said second Bragg reflector layer sequence includes a layer having a periodic pattern positioned in a direction of said beam to stabilize a polarization of said beam, wherein said laser radiation has a wavelength of about 850 nanometers, and wherein said periodic pattern has a period of between about 0.7 micrometers, and a thickness of between about 40 nanometers and about 70 nanometers.

34. A spectroscopic system, comprising a laser having:

a substrate;

a first Bragg reflector layer sequence on said substrate;

an active layer sequence on said first Bragg reflector layer sequence;

a second Bragg reflector layer sequence on said active layer sequence; and a voltage source for applying a voltage via said active layer sequence to generate a beam of laser radiation, wherein at least one of said first Bragg reflector layer sequence, said active layer sequence or said second Bragg reflector layer sequence includes a layer having a periodic pattern positioned in a direction of said beam to stabilize a polarization of said beam, wherein said laser radiation has a wavelength of about 850 nanometers, and wherein said periodic pattern has a period of between about 0.7 micrometers, and a thickness of between about 40 nanometers and about 70 nanometers.

35. A system for a measurement of a spectroscopic line, comprising a laser having:

a substrate;

a first Bragg reflector layer sequence on said substrate;

an active layer sequence on said first Bragg reflector layer sequence;

a second Bragg reflector layer sequence on said active layer sequence; and a voltage source for applying a voltage via said active layer sequence to generate a beam of laser radiation, wherein at least one of said first Bragg reflector layer sequence, said active layer sequence or said second Bragg reflector layer sequence includes a layer having a periodic pattern positioned in a direction of said beam to stabilize a polarization of said beam, wherein said laser radiation has a wavelength of about 850 nanometers, and wherein said periodic pattern has a period of between about 0.7 micrometers, and a thickness of between about 40 nanometers and about 70 nanometers.

* * * * *